United States Patent
Kim et al.

(10) Patent No.: US 7,964,908 B2
(45) Date of Patent: Jun. 21, 2011

(54) MEMORY DEVICES COMPRISING NANO REGION EMBEDDED DIELECTRIC LAYERS

(75) Inventors: Sun-Jung Kim, Giheung-gu (KR); Young-Sun Kim, Suwon (KR); Se-Hoon Oh, Hwasung (KR); Eun-Ha Lee, Seoul (KR); Young-Su Chung, Suwon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 441 days.

(21) Appl. No.: 12/111,239

(22) Filed: Apr. 29, 2008

(65) Prior Publication Data

US 2008/0265310 A1  Oct. 30, 2008

(30) Foreign Application Priority Data

Apr. 30, 2007  (KR) ................... 10-2007-0042057

(51) Int. Cl.
*H01L 29/792* (2006.01)
(52) U.S. Cl. ................. 257/325; 257/E29.309; 438/261
(58) Field of Classification Search .............. 257/325, 257/E29.309; 438/261
See application file for complete search history.

(56) References Cited

U.S. PATENT DOCUMENTS

| | | | |
|---|---|---|---|
| 7,378,310 B1 * | 5/2008 | Wang et al. | 438/240 |
| 7,476,927 B2 * | 1/2009 | Bhattacharyya | 257/314 |
| 2005/0045943 A1 * | 3/2005 | Lung et al. | 257/325 |
| 2005/0122775 A1 | 6/2005 | Koyonagi et al. | |
| 2006/0046384 A1 * | 3/2006 | Joo et al. | 438/257 |
| 2006/0110870 A1 | 5/2006 | Bhattacharyya | |
| 2007/0092989 A1 * | 4/2007 | Kraus et al. | 438/99 |
| 2007/0102750 A1 * | 5/2007 | Kim et al. | 257/314 |
| 2007/0232041 A1 * | 10/2007 | Choi et al. | 438/585 |
| 2009/0039417 A1 * | 2/2009 | Chen et al. | 257/326 |

FOREIGN PATENT DOCUMENTS

| | | | |
|---|---|---|---|
| JP | 2004055969 | | 2/2004 |
| KR | 1020050025350 A | | 3/2005 |
| KR | 1020060108088 A | | 10/2006 |
| WO | WO 2006088430 A1 * | | 8/2006 |

* cited by examiner

*Primary Examiner* — Steven J Fulk
(74) *Attorney, Agent, or Firm* — Volentine & Whitt, PLLC

(57) ABSTRACT

In one aspect, a memory cell includes a plurality of dielectric layers located within a charge storage gate structure. At least one of the dielectric layers includes an dielectric material including oxygen, and nano regions including oxygen embedded in the dielectric material, where an oxygen concentration of the dielectric material is the greater than an oxygen concentration of the nano regions. In another aspect, at least one of the dielectric layers includes a dielectric material and nano regions embedded in the dielectric material, where an atomic composition of the dielectric material is the same as the atomic composition of the nano regions, and a density of the dielectric material is the greater than a density of the nano regions.

17 Claims, 8 Drawing Sheets

MEMORY DEVICES COMPRISING NANO REGION EMBEDDED DIELECTRIC LAYERS

BACKGROUND OF THE INVENTION

1. Field of the Invention

The present invention generally relates to dielectric materials, and more particularly, the present invention relates to dielectric materials which include nano regions embedded therein. The dielectric materials may, for example, be utilized in the gate structure of a memory cell.

2. Description of the Related Art

The operating performance of a charge trap flash device can be enhanced by embedding metal-containing "nano crystals" or "nano dots" within the trapping layer of the charge trap flash device. As is understood in the art, the nano crystals or nano dots are effect in trapping charges, and have the functional advantage of being physically separated from one another to reduce charge leakage. In effect, such devices exhibit an enhance energy barrier which advantageously creates a "deep" charge trap. Examples include embedding nano regions of either metal (e.g., WN) or metal oxide (e.g., $HfO_2$) within a layer of silicon dioxide.

However, the formation of a trapping layer containing nano crystals or nano dots is a relatively complex and expensive endeavor. In addition, care must be taken during the formation process to ensure that the nano crystals or nano dots are sufficiently isolated from one another.

SUMMARY OF THE INVENTION

According to an aspect of the present invention, a layer is provided which includes a dielectric material and nano regions embedded in the dielectric material, where atomic components of the dielectric material are the same as atomic components of the nano regions, and a density of the nano regions is less than a density of the dielectric material.

According to another aspect of the present invention, a layer is provided is provided which includes a dielectric material including oxygen, and nano regions including oxygen embedded in the dielectric material, where an oxygen concentration of the dielectric material is the greater than an oxygen concentration of the nano regions.

According to still another aspect of the present invention, a memory cell is provided which includes a plurality of dielectric layers located within a charge storage gate structure, where at least one of the dielectric layers comprises an dielectric material including oxygen, and nano regions including oxygen embedded in the dielectric material, and where an oxygen concentration of the dielectric material is the greater than an oxygen concentration of the nano regions.

According to yet another aspect of the present invention, a memory cell is provided which includes a plurality of dielectric layers located within a charge storage gate structure, wherein at least one of the dielectric layers comprises a dielectric material and nano regions embedded in the dielectric material, where an atomic composition of the dielectric material is the same as the atomic composition of the nano regions, and a density of the dielectric material is the greater than a density of the nano regions.

According to another aspect of the present invention, a method of forming a layer is provided which includes depositing a layer of material including oxygen, and then annealing the layer of material to form nano regions within the annealed layer of material, where the nano regions have an oxygen concentration which is less than an oxygen concentration of the annealed layer of material.

According to still another aspect of the present invention, a method of forming a layer is provided which includes depositing a layer of material, and then annealing the layer of material to form nano regions within the layer of material, where a density of the nano regions is less than a density of the annealed layer of material.

BRIEF DESCRIPTION OF THE DRAWINGS

The above and other aspects and features of the present invention will become readily apparent from the detailed description that follows, with reference to the accompanying drawings, in which.

DETAILED DESCRIPTION OF PREFERRED EMBODIMENTS

The present invention will now be described by way of preferred, but non-limiting, embodiments of the invention.

For ease of understanding and to avoid redundancy, like reference numbers refer to the same or similar elements throughout the drawings. Also, while the drawings contain a number of cross-sectional views, it will be understood that the views are not necessarily drawn to scale, and that the relative thicknesses of the illustrated layers may be exaggerated for clarity. Further, when a layer is referred to as being formed "on" another layer, it can be directly on the other layer or one or more intervening layers may be present. In contrast, if a layer is referred to as being "directly on" another layer, then no intervening layers or elements are present. Other words used to describe the relationship between elements should be interpreted in a like fashion (e.g., "between" versus "directly between," "adjacent" versus "directly adjacent," "connected" versus "directly connected," etc.).

Figure 1:
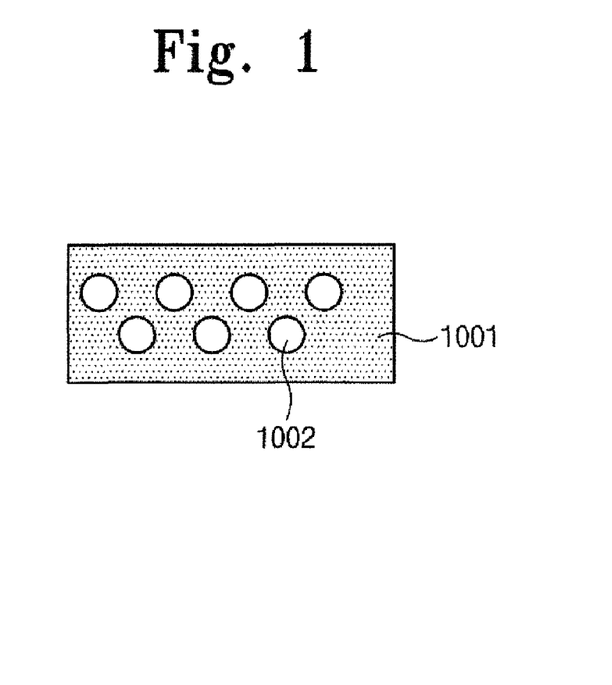
FIG. 1 is a cross-sectional schematic view of a dielectric material layer including nano regions according to an embodiment of the present invention.

FIG. 1 is a schematic cross-sectional view of a layer according to an embodiment of the present invention. Referring to the figure, the layer includes a dielectric material 1001 having a plurality of nano dots (also referred to herein as nano regions) 1002 embedded therein. As will be explained later by way of specific examples, atomic components of the dielectric material are the same as atomic components of the nano regions. Also, an atomic density of the nano regions 1002 may be less than an atomic density of the dielectric material 1001.

Herein, "atomic density" (or simply "density") means the total number of atoms per unit area. Alternately, or in addition, in the case where the dielectric material 1001 and the nano regions 1002 include oxygen, an oxygen concentration within the dielectric material 1001 may be greater than that of the nano regions 1002. A thickness (i.e., a vertical dimension relative to FIG. 1) of the dielectric material 1001 may, for example, be in the range of 50 Å to 300 Å both inclusive. A diameter of the nano regions 1102 may, for example, be in the range of 10 Å to 50 Å both inclusive.

In the specific embodiments that follow, examples are presented in which the atomic components of both the dielectric material 1001 and the nano regions 1002 include lanthanum (La), oxygen (O) and a metal, such as hafnium (Hf) or aluminum (Al). For example, the dielectric material 1001 may include $LaHfO_3$ (or $LaAlO_3$), and the nano regions 1002 may include $LaHfO_{3-x}$ (or $LaAlO_{3-x}$), where $3>x>0$.

Figure 2:
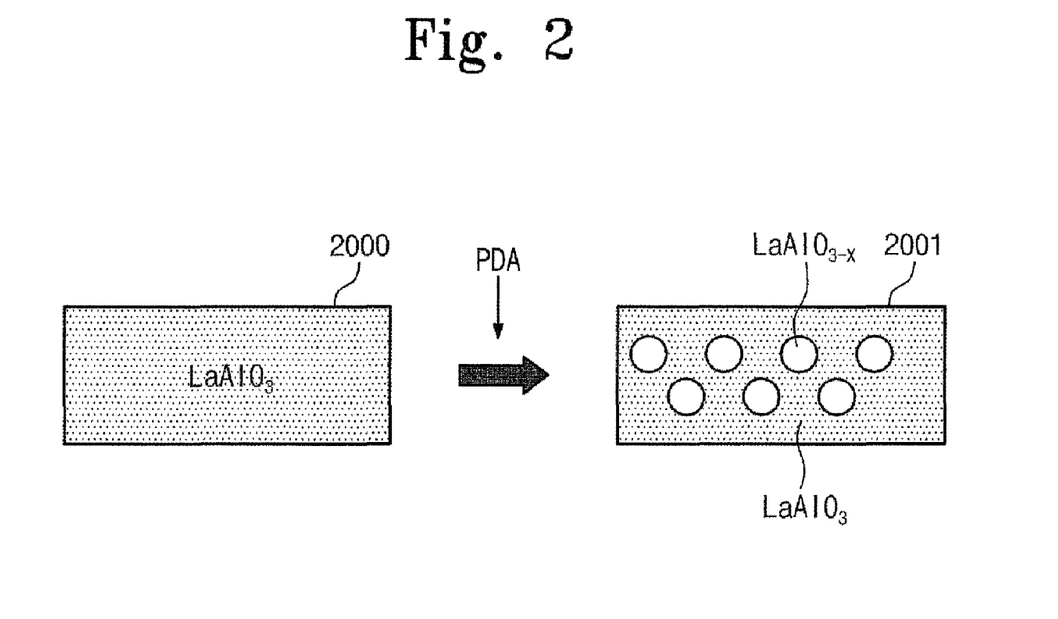
FIG. 2 is a cross-sectional schematic view of a dielectric material layer before and after a post-deposition anneal (PDA) according to another embodiment of the present invention.

The fabrication of the layer illustrated in FIG. 1 will now be described with reference to FIG. 2. In the example of FIG. 2, a layer is formed which includes $LaAlO_{3-x}$ nano regions embedded within a material of $LaAlO_3$.

Initially, a $LaAlO_3$ layer 2000 is formed at a thickness of, for example, about 50 Å to about 300 Å.

The $LaAlO_3$ layer 2000 may, for example, be formed by either atomic layer deposition (ALD) or phase vapor deposition (PVD). In the case of ALD, the La source may be $La(iPrCp)_3$, the Al source may be TMA, and the substrate temperature may be about 350° C. to 500° C. (e.g., 450° C.). In the case of PVD, the chamber pressure may be about 3 to 20 mTorr, the substrate temperature may be about 25 to 500° C., the target power may be about 50 to 300 Watts, an Argon flow rate may be 20 to 40 sccm, and an $O_2$ flow rate may be about 1 to 10 sccm. One example of the PVD target is a $LaAlO_3$ single crystal target (with or without $O_2$). Other examples includes a LaAl target with $O_2$, or separate La and Al targets with $O_2$.

Next, a post-deposition anneal (PDA) process is carried out to form $LaAlO_{3-x}$ nano regions (where $3>x>0$) within the $LaAlO_3$ layer, thereby defining a layer 2001 schematically shown in FIG. 2. In other words, an oxygen concentration of the $LaAlO_{3-x}$ nano regions is less than an oxygen concentration of the $LaAlO_3$ layer. Also, an atomic density of the $LaAlO_{3-x}$ nano regions is less than an atomic density of $LaAlO_3$ layer.

As an example, the PDA process may be a rapid thermal anneal (RTA) at about 800° C. to 1000° C., preferably at 850° C. to 1000° C., for about 30 seconds to 180 seconds, in an atmosphere of at least one of $N_2$, $H_2$ and Ar.

Figure 3:
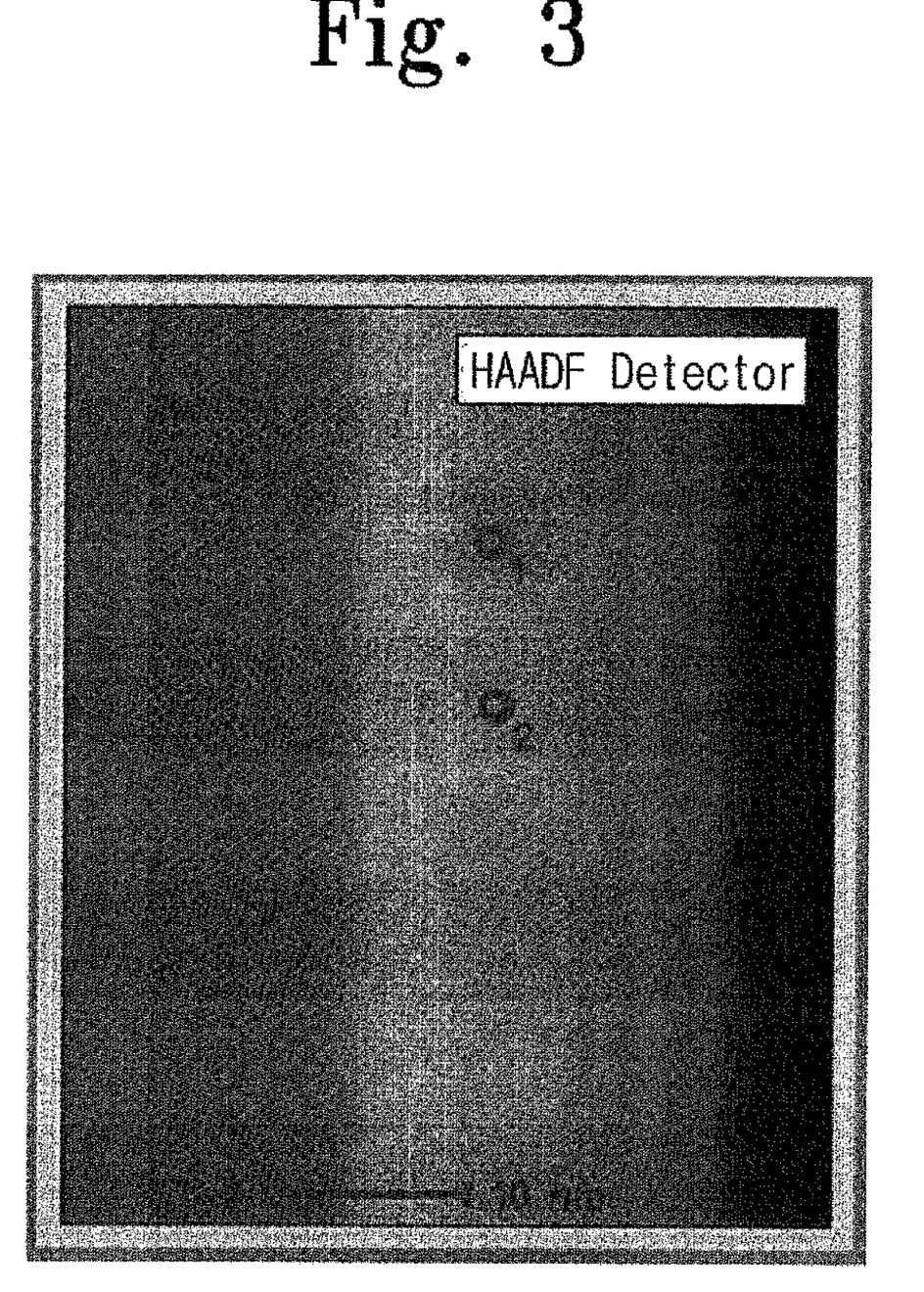
FIG. 3 is an HAAFD image of a layer according to an embodiment of the present invention.

FIG. 3 illustrates a High Angle Annular Dark Field (HAADF) image of a $LaAlO_3$ layer after PDA at 950° for about 30 seconds. EDX spectra obtained from region "1" and region "2" of FIG. 3 are illustrated in FIGS. 4A and 4B, respectively.

Figure 4A:
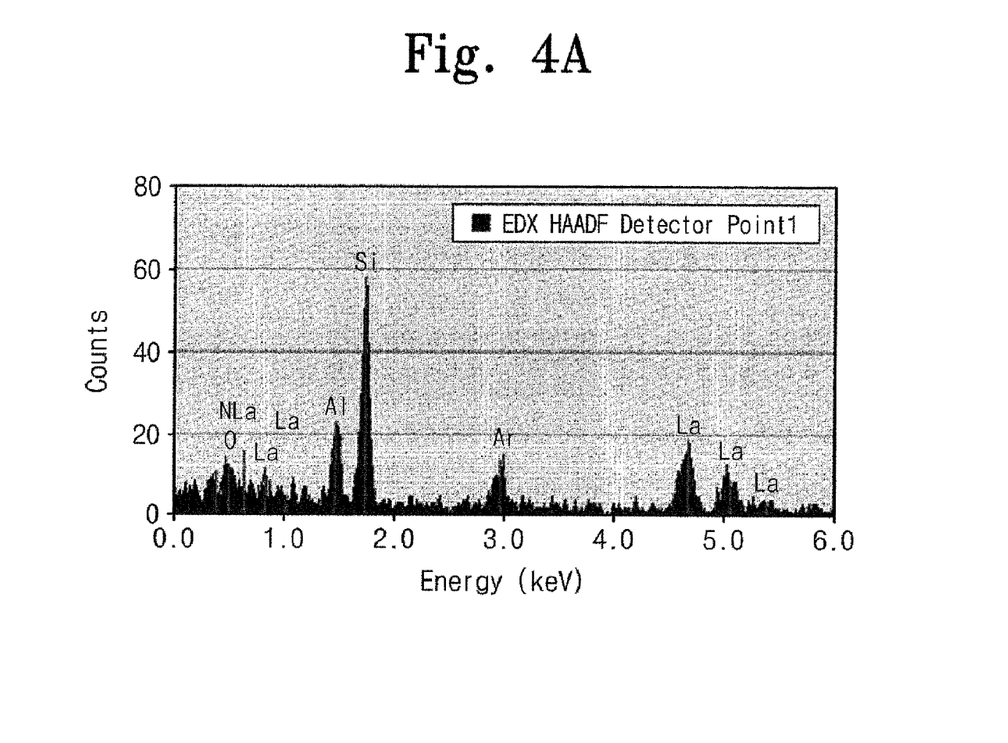
FIGS. 4A and 4B illustrate EDX spectra of regions contained in the image of FIG. 3.
Figure 4B:
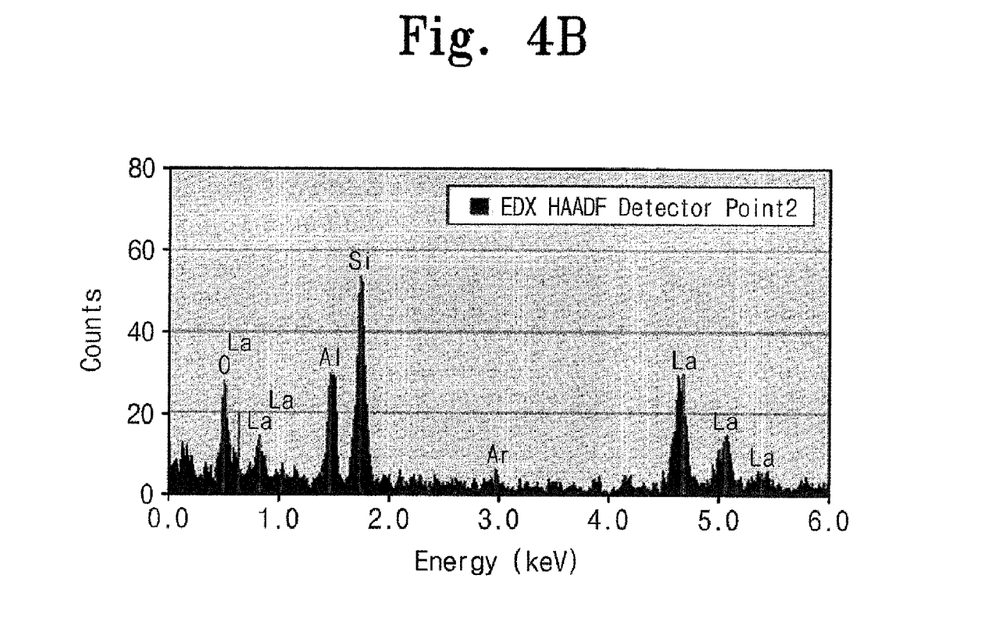

FIG. 4A indicates a count ratio La:Al:O of about 20:20:10, whereas FIG. 4B indicates an count ratio La:Al:O of about 30:30:30. Thus, it can be seen that the atomic density of region "1" is less than that of region "2". Further, an oxygen concentration of region "1" is less than that of region "2". Thus, the EDX spectra confirm the presence of a nano region at region "1" of FIG. 3.

Figure 5A:
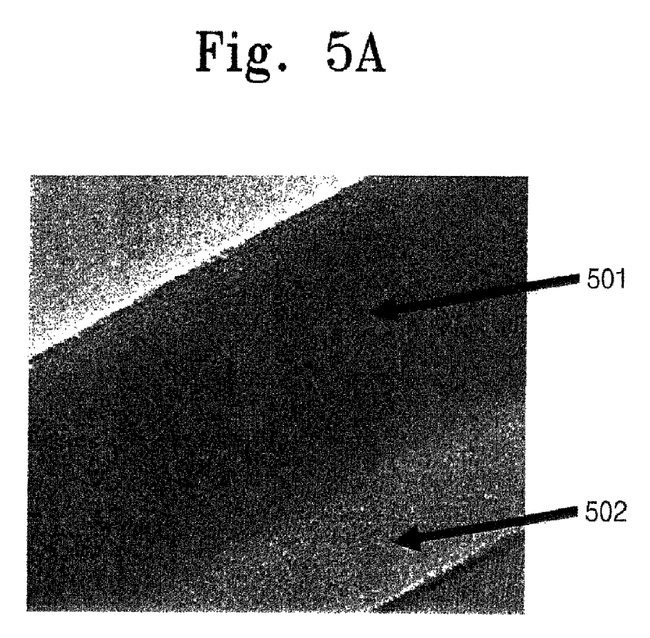
FIGS. 5A through 5C are HAAFD images for use in describing the effects of post deposition anneal (PDA) in accordance with embodiments of the present invention.
Figure 5B:
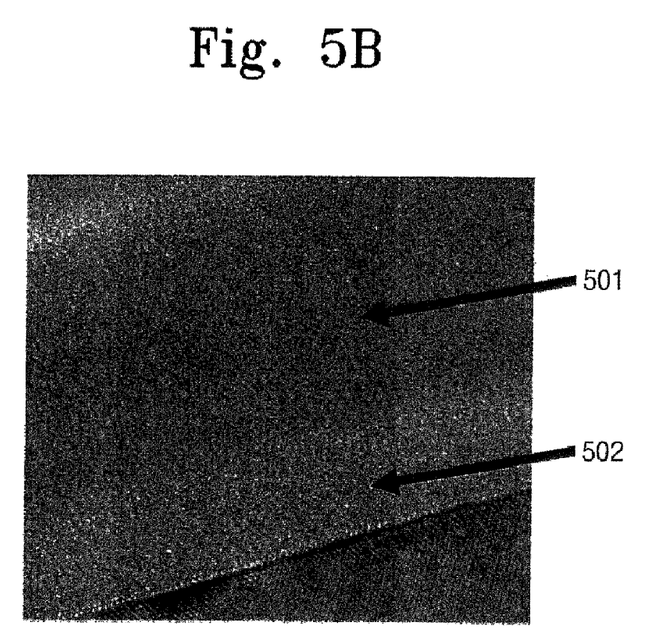

In addition, the presence of nano regions resulting from PDA can be visually confirmed by imaging. FIG. 5A illustrates an HAAFD image of a $LaAlO_3$ layer 501 formed over a silicon dioxide (SiO2) layer 502 in the case where were no PDA has been carried out, and FIG. 5B is an HAAFD image of the same in the case where a PDA at 800° C. has been carried out. No nano regions are visually perceptible in either of FIGS. 5A and 5B.

Figure 5C:
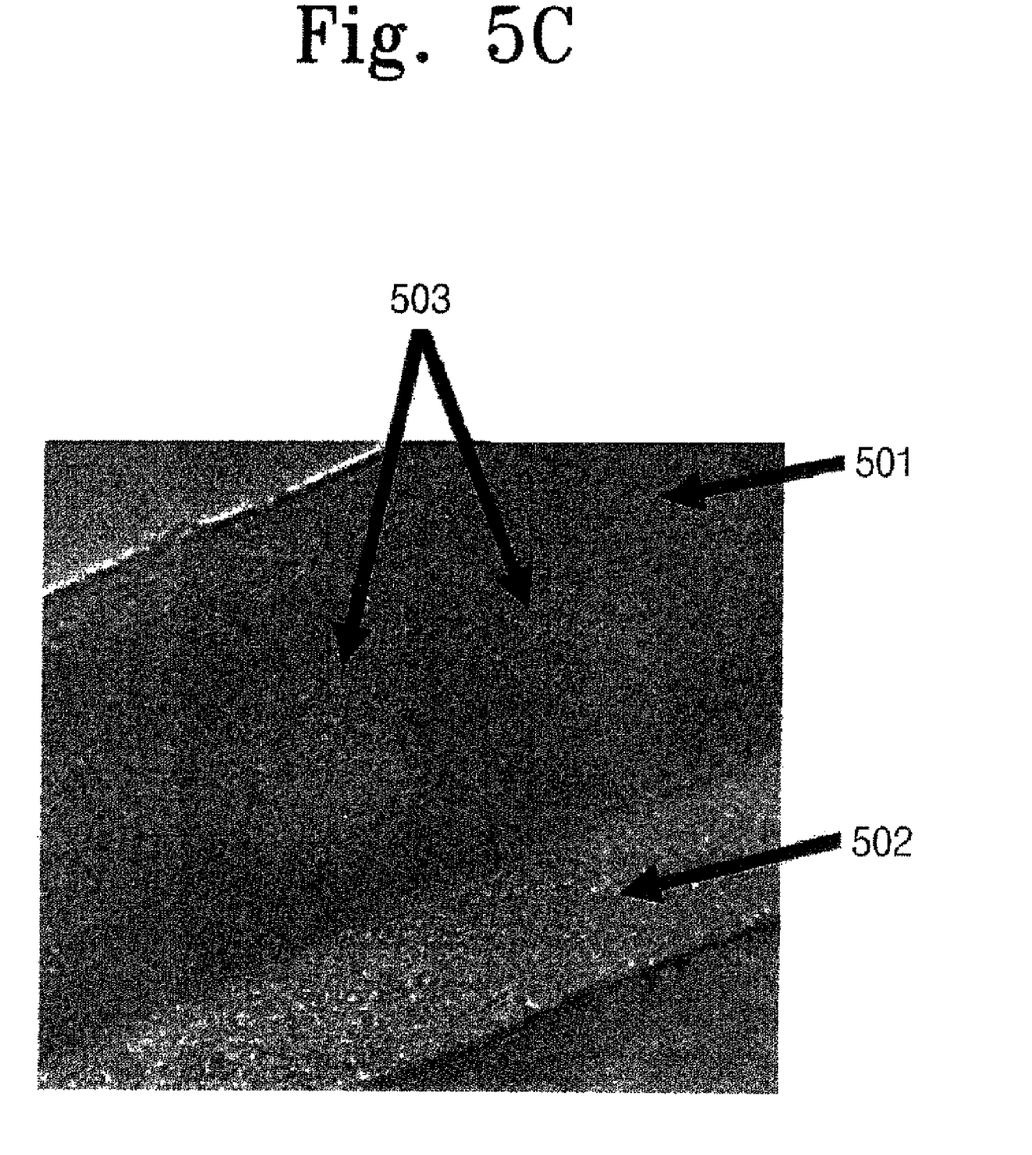

FIG. 5C shows an HAAFD image after execution of a PDA at about 950° C. for about 30 seconds. In this case, nano regions 503 are visually perceptible, each having a diameter of about 10 Å to about 50 Å. Also, as shown, the nano regions 503 are well-isolated from one another.

The fabrication of a charge trap flash (CTF) device according to an embodiment of the present invention will now be described with reference to FIGS. 6A through 6D of the drawings.

Figure 6A:
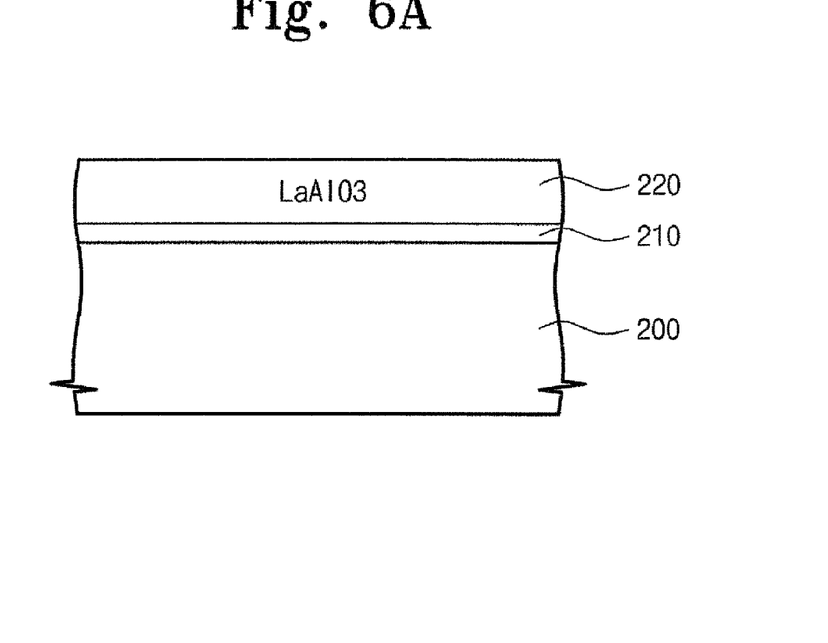
FIGS. 6A through 6D are schematic cross-sectional views for use in describing a method of fabricating a charge trap flash (CTF) device according to an embodiment of the present invention.

Referring initially to FIG. 6A, a tunneling layer 210 and an insulating layer 220 are successively formed over the surface of a silicon substrate 200.

The tunneling layer 210 is generally formed of a dielectric material (for example, silicon dioxide), and may, for example, have a thickness of about 5 to 50 Å.

The insulating layer 220 of this example is formed of $LaAlO_3$, and may, for example, have a thickness of 50 Å to 300 Å both inclusive.

The insulating layer 220 is preferably formed by either atomic layer deposition (ALD) or phase vapor deposition (PVD). In the case of ALD, the La source may be $La(iPrCp)_3$, the Al source may be trimethyl aluminum (TMA), and the substrate temperature may be about 350° C. to 500° C. (e.g., 450° C.). In the case of PVD, the chamber pressure may be about 3 to 20 mTorr, the substrate temperature may be about 25 to 500° C., the target power may be about 50 to 300 Watts, an Argon flow rate may be about 20 to 40 sccm, and an $O_2$ flow rate may be about 1 to 10 sccm. One example of the PVD target is a $LaAlO_3$ single crystal target (with or without $O_2$). Other target examples includes a LaAl target with $O_2$, or separate La and Al targets with $O_2$.

Figure 6B:
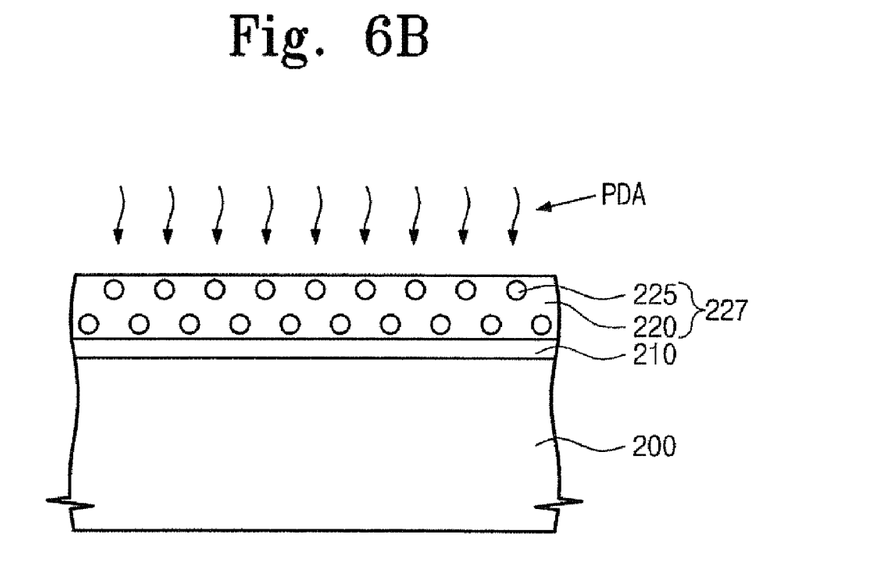

Referring next to FIG. 6B, a post-deposition anneal (PDA) process is carried out to form nano regions 225 within the insulating layer 220, thereby defining a charge storage layer 227. In this example, the nano regions 225 are regions of $LaAlO_{3-x}$, where $3>x>0$. In other words, an oxygen concentration of the nano regions 225 is less than an oxygen concentration of the insulating layer 220, and further, an atomic density of the nano regions 225 is less than an atomic density of the insulating layer 220. As an example, the PDA process may be a rapid thermal anneal (RTA) at about 800° C. to 1000° C. for about 30 seconds to 180 seconds, in an atmosphere of at least one of $N_2$, $H_2$ and Ar.

Figure 6C:
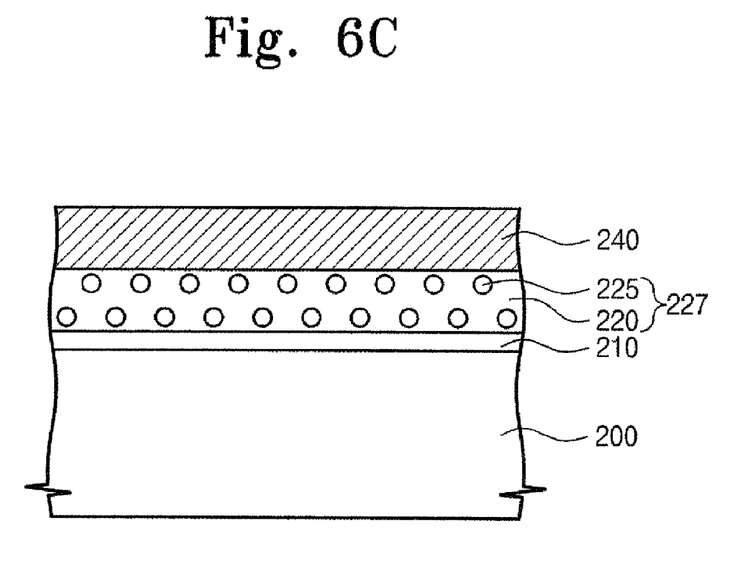

Referring now to FIG. 6C, an electrode layer 240 is formed on the charge storage layer 227. The electrode layer 240 may be formed of polysilicon and/or one or more metal materials.

Figure 6D:
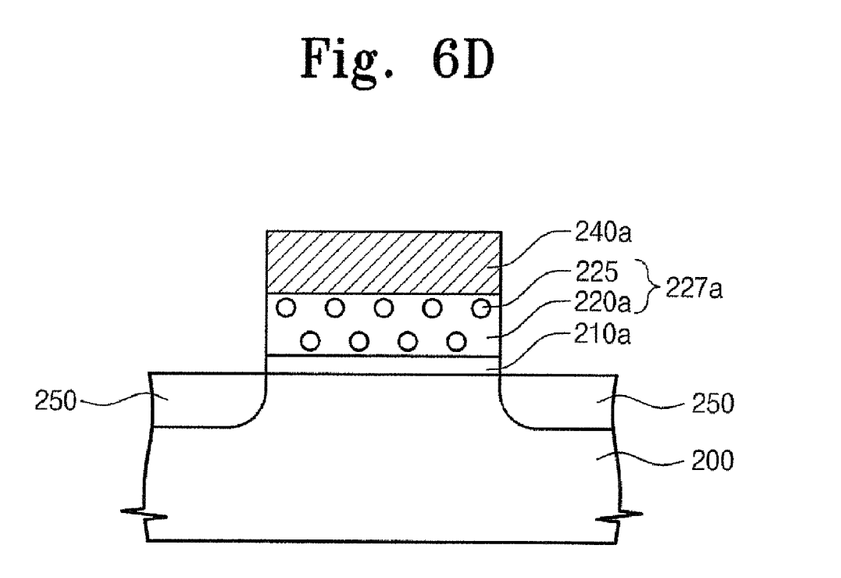

Next, referring to FIG. 6D, the electrode layer 240, the charge storage layer 227, and the tunneling layer 210 are patterned to define a gate structure (referred to herein as a charge storage gate). As shown, the charge storage gate of this example includes a gate electrode 240a, a charge storage layer 227a, and a tunneling layer 210a. The charge storage layer 227a includes dielectric material layer 220a having the nano regions 225 embedded therein. Source/drain regions 250 are then formed using the gate structure as an implantation mask.

In operation, the oxygen deficient and low-density nano regions 225 may be effectively utilized to trap charges within the charge storage gate.

Figure 7:
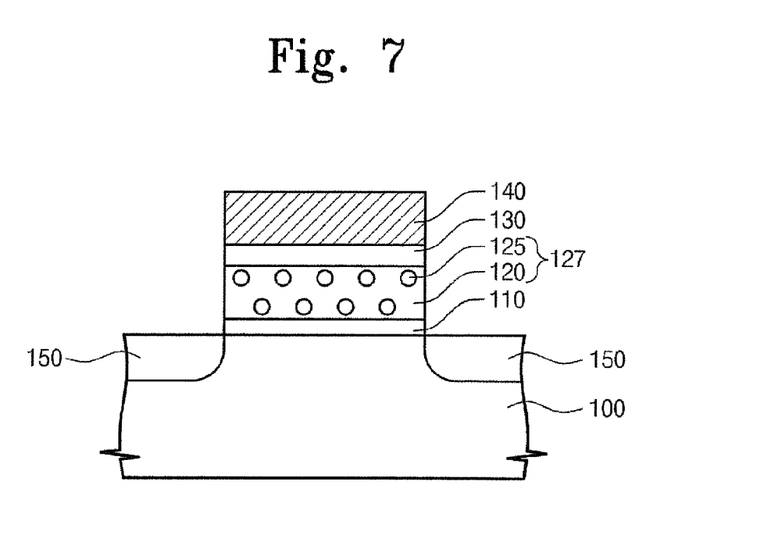
FIG. 7 is a schematic cross-sectional view of a CTF device according to another embodiment of the present invention.

FIG. 7 is a cross-sectional view of an alternative embodiment in which a blocking layer is located between the charge trap layer and the gate electrode.

In particular, referring to FIG. 7, a channel region of a substrate 100 is defined between source/drain regions 150. A charge storage gate structure is located over the channel region, and includes a tunneling layer 110, a charge trap layer 127, a blocking layer 130, and a gate electrode 140. The blocking layer 130 may, for example, be formed of an insulating material such as silicon dioxide. The charge trap layer 127, which may be formed according to the previously described embodiments, includes nano regions 125 embedded within a dielectric material layer 120.

Figure 8:
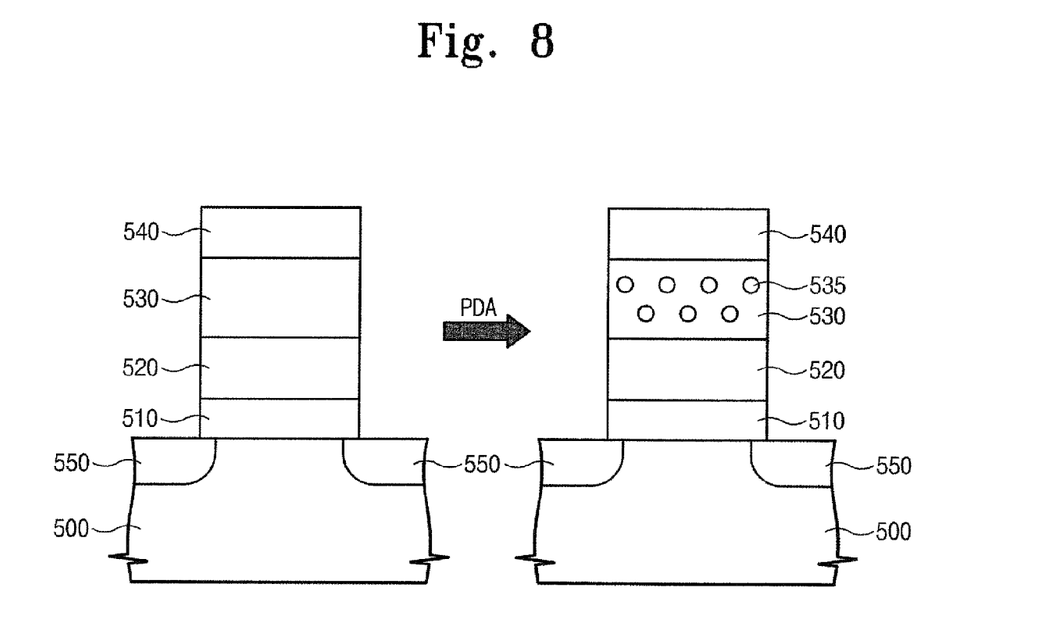
FIG. 8 illustrates schematic cross-sectional views for use in describing the fabrication of a CTF device according to another embodiment of the present invention.

Attention is now directed to FIG. 8 for use in describing another embodiment of the present invention. Referring first to the left of FIG. 8, a channel region of a substrate 500 is defined between source/drain regions 550. Gate structure is located over the channel region and includes a tunneling layer 510, a charge trap layer 520, a blocking layer 530, and a gate electrode 540.

In the example of this embodiment, the blocking layer 530 is formed of a material which will result in the formation of nano regions when subject to PDA. For example, the blocking layer 530 may be formed of $LaHfO_3$ or $LaAlO_3$. After deposition of the blocking layer 530, a PDA process (e.g., 800° C. to 1000° C.) is carried out to form nano regions 535 within the blocking layer 530. As with the previous embodiments, the nano regions 535 are oxygen deficient regions and/or low atomic density regions. In effect, the block layer 530 is densified by the PDA, can be effectively utilized as a high-K material layer. It is noted that the PDA can be carried out prior to patterning of the gate structure and prior to formation of the source/drain regions 550.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A memory cell comprising:
a substrate; and
a charge storage gate at an upper portion of the substrate, the charge storage gate including a gate electrode and a plurality of dielectric layers interposed between the gate electrode and the substrate,
wherein at least one of the dielectric layers comprises a dielectric material and nano regions embedded in the dielectric material,
wherein an atomic composition of the dielectric material includes oxygen, an atomic composition of the nano regions includes as oxygen, and an oxygen concentration of the dielectric material is greater than an oxygen concentration of the nano regions.

2. The memory cell of claim 1, wherein the dielectric material and the nano regions consists of the same atomic elements.

3. The memory cell of claim 2, wherein the atomic elements of each of the dielectric material and the nano regions comprise La, 0, and a metal.

4. The memory cell of claim 3, wherein the metal is at least one of Hf and Al.

5. The memory cell of claim 4, wherein the at least one dielectric layer is a charge trap layer of the charge storage gate.

6. The memory cell of claim 1, wherein each of the nano regions has a diameter in the range of 10 Å to 50 Å both inclusive.

7. The memory cell of claim 6, wherein the at least one of the dielectric layers is a layer having a thickness in the range of 50 Å to 300 Å both inclusive.

8. The memory cell of claim 1, wherein the plurality of dielectric layers comprise a tunneling layer and a charge trap layer, and wherein the nano regions are embedded in the charge trap layer.

9. The memory cell of claim 1, wherein the plurality of dielectric layers comprise a tunneling layer, a charge trap layer, and a blocking layer, and wherein the nano regions are embedded in at least one of the charge trap layer and the blocking layer.

10. A memory cell comprising:
a substrate; and
a charge storage gate at an upper portion of the substrate, the charge storage gate including a gate electrode and a plurality of dielectric layers interposed between the gate electrode and the substrate,
wherein at least one of the dielectric layers comprises a dielectric material and nano regions embedded in the dielectric material,
wherein a composition of the dielectric material and a composition of the nano regions consist of the same atomic elements, and an atomic density of the dielectric material is greater than an atomic density of the nano regions.

11. The memory cell of claim 10, wherein the atomic elements of each of the dielectric material and the nano regions comprise La, 0, and a metal.

12. The memory cell of claim 11, wherein the metal is at least one of Hf and Al.

13. The memory cell of claim 10, wherein the at least one dielectric layer is a charge trap layer of the charge storage gate structure.

14. The memory cell of claim 10, wherein a each of the nano regions has a diameter in the range of 10 Å to 50 Å both inclusive.

15. The memory cell of claim 14, wherein the at least one of the dielectric layers is a layer having a thickness in the range of 50 Å to 300 Å both inclusive.

16. The memory cell of claim 10, wherein the plurality of dielectric layers comprise a tunneling layer and a charge trap layer, and wherein the nano regions are embedded in the charge trap layer.

17. The memory cell of claim 10, wherein the plurality of dielectric layers comprise a tunneling layer, a charge trap layer, and a blocking layer, and wherein the nano regions are embedded in at least one of the charge trap layer and the blocking layer.

* * * * *